(12) United States Patent
Lee et al.

(10) Patent No.: US 11,543,709 B2
(45) Date of Patent: Jan. 3, 2023

(54) DISPLAY SUBSTRATE, METHOD OF TESTING THE SAME, AND DISPLAY DEVICE INCLUDING THE SAME

(71) Applicant: Samsung Display Co., LTD., Yongin-si (KR)

(72) Inventors: Seung-Kyu Lee, Cheonan-si (KR); Hyunseong Kang, Cheonan-si (KR); Suin Kim, Gunpo-si (KR); Byeongjae Ahn, Asan-si (KR); Gijung Lee, Asan-si (KR); Byeonghoon Cho, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 79 days.

(21) Appl. No.: 17/011,971

(22) Filed: Sep. 3, 2020

(65) Prior Publication Data

US 2021/0134840 A1     May 6, 2021

(30) Foreign Application Priority Data

Nov. 1, 2019   (KR) .......................... 10-2019-0138551

(51) Int. Cl.
| | | |
|---|---|---|
| G02F 1/1345 | (2006.01) | |
| G02F 1/1362 | (2006.01) | |
| H01L 27/12 | (2006.01) | |
| H01L 21/66 | (2006.01) | |
| H01L 27/32 | (2006.01) | |
| H01L 21/768 | (2006.01) | |

(52) U.S. Cl.
CPC ........ *G02F 1/1345* (2013.01); *G02F 1/13452* (2013.01); *G02F 1/13458* (2013.01); *G02F 1/136286* (2013.01); *H01L 21/76894* (2013.01); *H01L 22/20* (2013.01); *H01L 27/124* (2013.01); *H01L 27/3276* (2013.01)

(58) Field of Classification Search
CPC . G02F 1/13458; G02F 1/13452; G02F 1/1345
See application file for complete search history.

(56) References Cited

U.S. PATENT DOCUMENTS

| | | | |
|---|---|---|---|
| 7,839,479 B2 | 11/2010 | Choi | |
| 9,772,523 B2* | 9/2017 | Lim | ...................... G02F 1/1339 |
| 2019/0310509 A1* | 10/2019 | Shin | ..................... G02F 1/13452 |

FOREIGN PATENT DOCUMENTS

| | | |
|---|---|---|
| KR | 10-0671640 | 1/2007 |
| KR | 10-2016-0124981 | 10/2016 |
| KR | 10-2018-0076744 | 7/2018 |

* cited by examiner

*Primary Examiner* — Dung T Nguyen
(74) *Attorney, Agent, or Firm* — H.C. Park & Associates, PLC

(57) ABSTRACT

A display substrate including a base substrate having a display area and a non-display area around the display area, a plurality of gate lines disposed in the display area and extending in a first direction, a plurality of data lines disposed in the display area, insulated from the gate lines, and extending in a second direction crossing the first direction, and a plurality of data line extension portions extending from the data lines to the non-display area, in which each of the data line extension portions includes a first portion and a second portion disposed at a higher position than the first portion.

20 Claims, 16 Drawing Sheets

DISPLAY SUBSTRATE, METHOD OF TESTING THE SAME, AND DISPLAY DEVICE INCLUDING THE SAME

CROSS-REFERENCE TO RELATED APPLICATION

This application claims priority from and the benefit of Korean Patent Application No. 10-2019-0138551, filed on Nov. 1, 2019, which is hereby incorporated by reference for all purposes as if fully set forth herein.

BACKGROUND

Field

Exemplary embodiments of the invention relate generally to a display substrate, a method of testing the display substrate, and more specifically to a display device including the display substrate.

Discussion of the Background

In recent years, various display devices, such as a liquid crystal display, an organic light emitting display, an electrowetting display device, a plasma display panel, and an electrophoretic display device, are being developed.

The display device includes a display substrate on which a plurality of signal lines is arranged. In general, an open/short test of the signal lines is performed by applying a test signal to one side of the signal lines and measuring the applied test signal at an opposite side of the signal lines.

The above information disclosed in this Background section is only for understanding of the background of the inventive concepts, and, therefore, it may contain information that does not constitute prior art.

SUMMARY

Display devices constructed according to exemplary embodiments of the invention are capable of easily testing an open/short of signal lines.

Exemplary embodiments provide a method of testing the display substrate, and a display device including the display substrate.

Additional features of the inventive concepts will be set forth in the description which follows, and in part will be apparent from the description, or may be learned by practice of the inventive concepts.

A display substrate according to an exemplary embodiment includes a base substrate including a display area and a non-display area around the display area, a plurality of gate lines disposed in the display area and extending in a first direction, a plurality of data lines disposed in the display area, insulated from the gate lines, and extending in a second direction crossing the first direction, and a plurality of data line extension portions extending from the data lines to the non-display area, in which each of the data line extension portions includes a first portion and a second portion disposed at a higher position than the first portion.

A method of testing a display substrate according to another exemplary embodiment includes preparing the display substrate including a plurality of gate lines extending in a first direction, a plurality of data lines extending in a second direction crossing the first direction, and a plurality of data line extension portions extending from one sides of the data lines, applying a test signal to the data line extension portions, and measuring the test signal applied to the data line extension portions at the other sides of the data lines, in which each of the data line extension portions includes a first portion and a second portion disposed at a higher position than the first portion.

A display device according to still another exemplary embodiment includes a first base substrate having a display area and a non-display area around the display area, a plurality of gate lines disposed in the display area and extending in a first direction, a plurality of data lines disposed in the display area, insulated from the gate lines, and extending in a second direction crossing the first direction, a plurality of pixels connected to the gate lines and the data lines, and a plurality of data line extension portions extending from the data lines to the non-display area, in which each of the data line extension portions includes a first portion and a second portion disposed at a higher position than the first portion.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
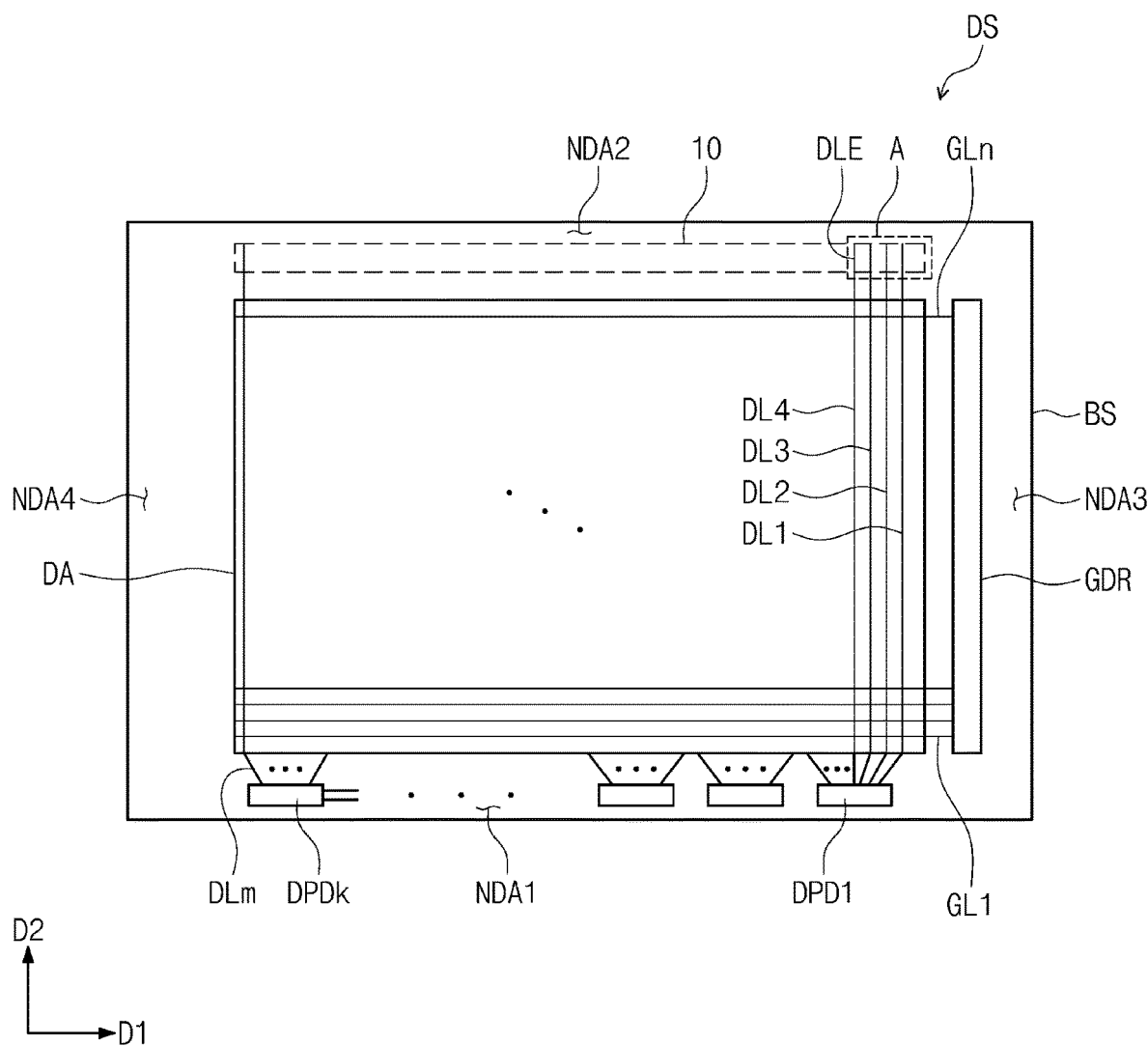
FIG. 1 is a plan view showing a display substrate according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, the present disclosure will be explained in detail with reference to the accompanying drawings.

FIG. 1 is a plan view showing a display substrate DS according to an exemplary embodiment.

Referring to FIG. 1, the display substrate DS may include a base substrate BS, a plurality of gate lines GL1 to GLn, a plurality of data lines DL1 to DLm, a first test portion 10, and data pads DPD1 to DPDk.

The base substrate BS may have long sides in a first direction D1 and short sides in a second direction D2. The second direction D2 may cross the first direction D1. The base substrate BS may have substantially a rectangular shape in a third direction D3. The third direction D3 is perpendicular to a plane defined by the first and second directions D1 and D2. As used herein, the term "when viewed in a plan view" may refer a state of being viewed in the third direction D3.

However, directions indicated by the first, second, and third directions D1, D2, and D3 are relative to each other, and thus, the directions indicated by the first, second, and third directions D1, D2, and D3 may be changed to other directions.

The base substrate BS may be an insulating substrate having a light transmitting property, such as a plastic substrate or a glass substrate. The base substrate BS may include a display area DA and a non-display area NDA around the display area DA.

The gate lines GL1 to GLn may be insulated from the data lines DL1 to DLm while crossing the data lines DL1 to DLm in the display area DA of the base substrate BS. Each of "m" and "n" may be a natural number. In particular, the gate lines GL1 to GLn extend in the first direction D1 in the display area DA, and the data lines DL1 to DLm extend in the second direction D2 in the display area DA.

The non-display area NDA of the base substrate BS may include a first non-display area NDA1 defined adjacent to a lower side of the display area DA, a second non-display area NDA2 defined adjacent to an upper side of the display area DA, a third non-display area NDA3 defined adjacent to a right side of the display area DA, and a fourth non-display area NDA4 defined adjacent to a left side of the display area DA.

The data pads DPD1 to DPDk may be disposed in the first non-display area NDA1. "k" may be a natural number less than the "m". One side of each of the data lines DL1 to DLm arranged in the display area DA may extend to the first non-display area NDA1, and may be connected to the data pads DPD1 to DPDk. Each of the data pads DPD1 to DPDk may be connected to a predetermined number of data lines DL1 to DLm.

Each of the data pads DPD1 to DPDk may be connected to corresponding source driving chips. The source driving chips may provide a data voltage to the data pads DPD1 to DPDk.

Data line extension portions DLE may be arranged in the second non-display area NDA2. Each of the data line extension portions DLE may extend from the other side of each of the data lines DL1 to DLm. The number of the data line extension portions DLE may be the same as the number of the data lines DL1 to DLm. That is, the number of the data line extension portions DLE may be "m". The data line extension portions DLE may be electrically connected to the data pads DPD1 to DPDk through the data lines DL1 to DLm.

The first test portion 10 may be disposed in the second non-display area NDA2 located at a position opposite to the first non-display area NDA1. The first test portion 10 may include the data line extension portions DLE. The first test portion 10 will be described later in more detail.

A gate driver GDR may be disposed in the third non-display area NDA3. The gate driver GDR may be connected to the gate lines GL1 to GLn. In particular, one side of each of the gate lines GL1 to GLn arranged in the display area DA may extend to the third non-display area NDA3, and may be connected to the gate driver GDR. The gate driver GDR may provide gate signals to the gate lines GL1 to GLn.

Figure 2:
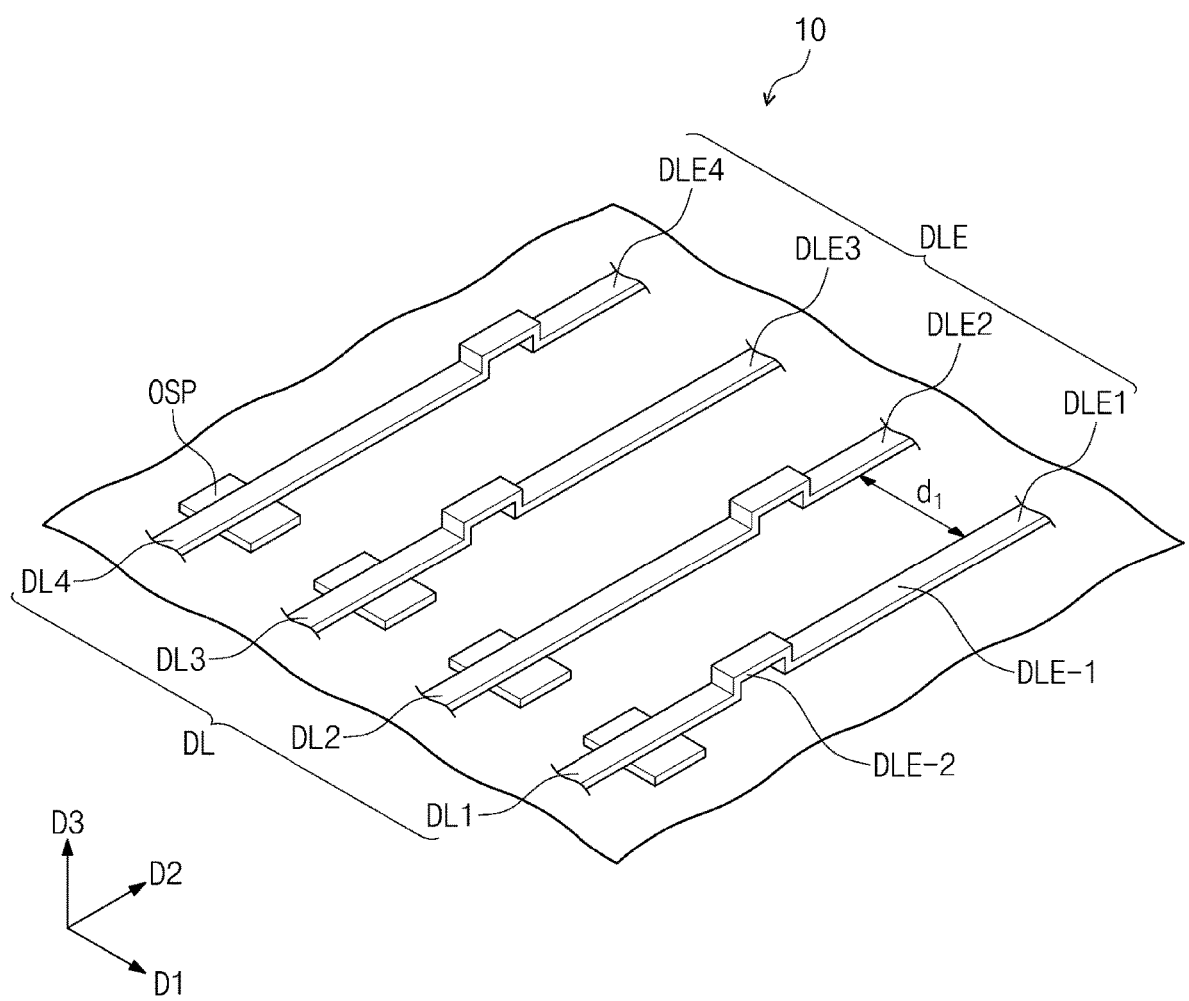
FIG. 2 is a partially enlarged perspective view showing portion A of FIG. 1.
Figure 3:
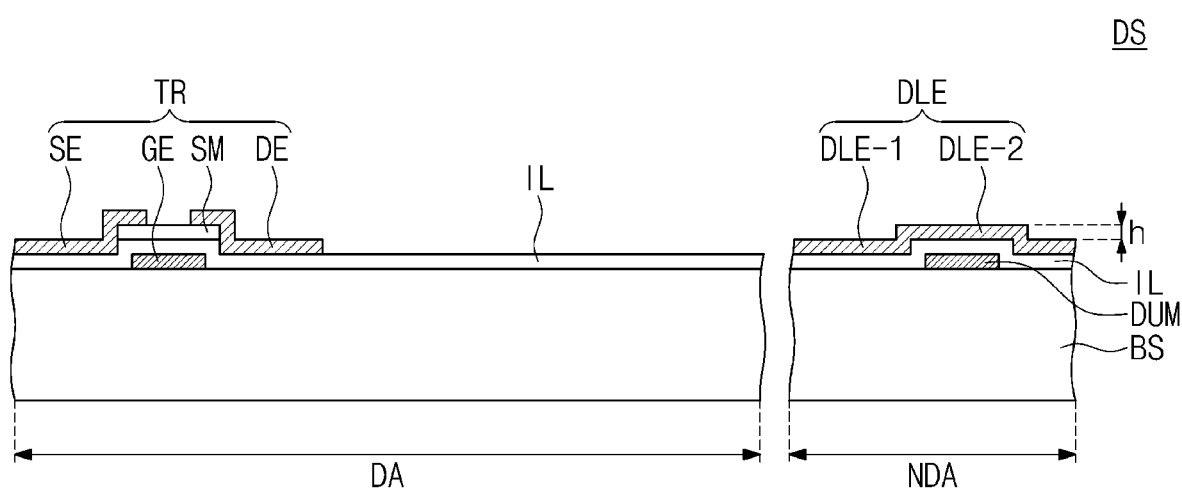
FIG. 3 is a cross-sectional view of the display substrate of FIG. 1.
Figure 4:
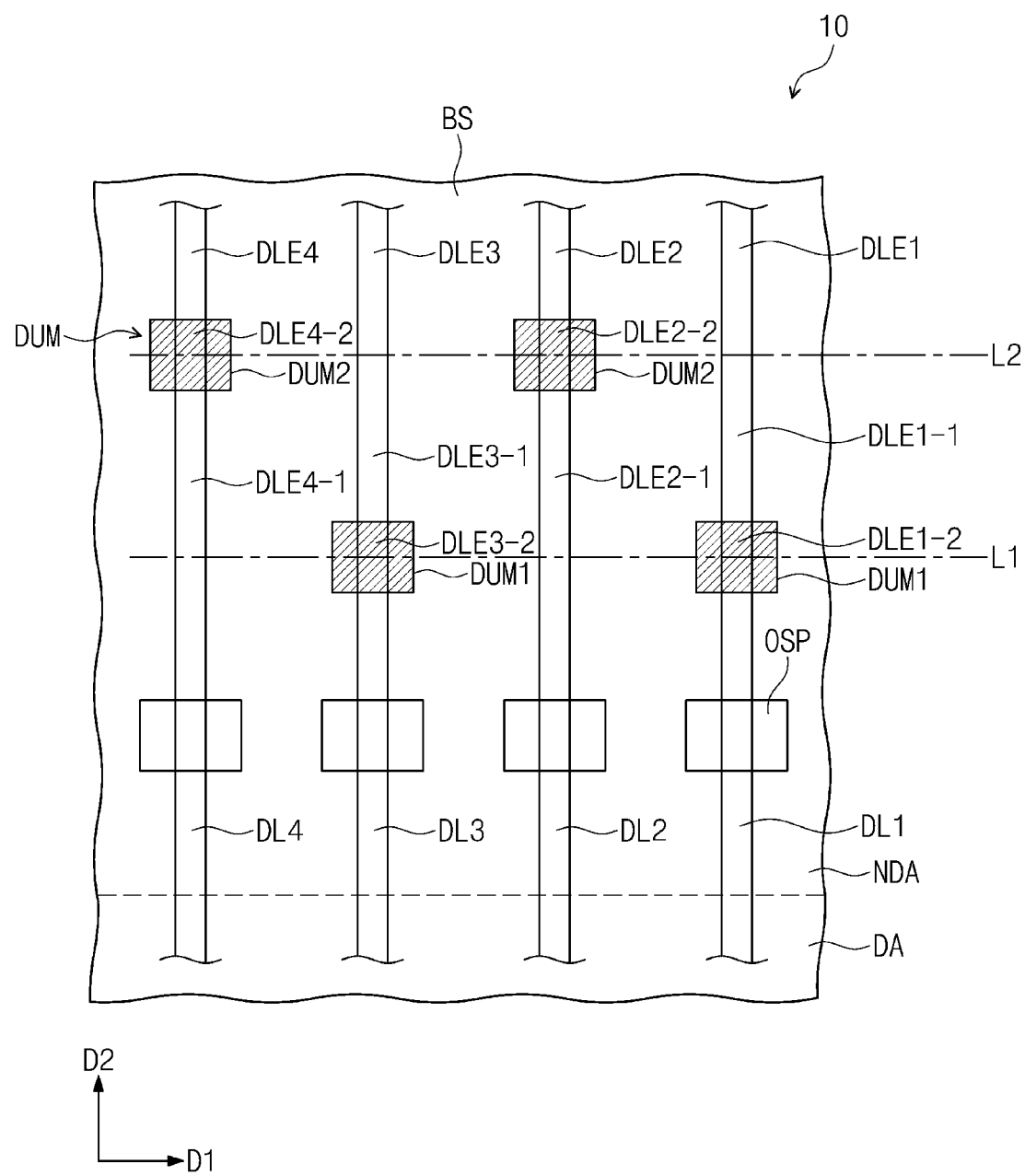
FIG. 4 is a plan view showing portion A of FIG. 1.

FIG. 2 is a partially enlarged perspective view showing portion A of FIG. 1, FIG. 3 is a cross-sectional view of the display substrate DS shown in FIG. 1, and FIG. 4 is a plan view showing portion A of FIG. 1.

Hereinafter, the first test portion 10 will be described in detail with reference to FIGS. 2 to 4.

FIGS. 2 to 4 exemplarily show four data line extension portions DLE1, DLE2, DLE3, and DLE4. Among the four data line extension portions DLE1, DLE2, DLE3, and DLE4, a first data line extension portion DLE1 and a third data line extension portion DLE3 may correspond to odd-numbered data line extension portions among the data line extension portions. A second data line extension portion DLE2 and a fourth data line extension portion DLE4 may correspond to even-numbered data line extension portions among the data line extension portions.

For the convenience of explanation, an insulating layer is not illustrated in FIG. 4.

Referring to FIG. 2, the first test portion 10 may include the data line extension portions DLE and a plurality of output selection pads (O/S pads or OS pads) OSP.

Each of the data line extension portions DLE may extend from one data line DL. A distance d1 between the data line extension portions DLE may be the same as a distance between the data lines DL. For example, the distance d1 between the data line extension portions DLE may be equal to or less than about 50 micrometers.

The O/S pads OSP may be disposed at one side of each of the data line extension portions DLE, and may make contact with the data line extension portions DLE. When a defect occurs on a specific data line DL in the process of testing the data lines DL, the O/S pads OSP may be used to more accurately test whether a corresponding data line DL is defective.

Each of the data line extension portions DLE may include a first portion DLE-1 and a second portion DLE-2. The second portion DLE-2 may extend from the first portion DLE-1 and may be disposed at a relatively higher position than that of the first portion DLE-1. In one data line extension portion DLE, a portion other than the second portion DLE-2 may be defined as the first portion DLE-1.

Referring to FIG. 3, a transistor TR and the data line extension portion DLE may be disposed on the base substrate BS. The base substrate BS may include the display area DA and the non-display area NDA around the display area DA.

The transistor TR may be disposed in the display area DA of the base substrate BS. The transistor TR may include a gate electrode GE, a semiconductor layer SM, a source electrode SE, and a drain electrode DE. The gate electrode GE may be disposed on the base substrates BS. The gate electrode GE may be branched from a corresponding gate line among the gate lines GL1 to GLn (refer to FIG. 1). More particularly, the gate electrode GE and the gate lines GL1 to GLn may be disposed on the same layer.

An insulating layer IL may be disposed on the gate electrode GE. The insulating layer IL may be disposed on the gate electrode GE and the base substrate BS. A portion of the insulating layer IL disposed on the gate electrode GE may protrude toward the third direction DR3. The semiconductor layer SM may be disposed on the insulating layer IL that overlaps the gate electrode GE. The source electrode SE may be disposed on the insulating layer IL and the semiconductor layer SM. The source electrode SE may be branched from a corresponding data line among the data lines DL1 to DLm, and may make contact with the semiconductor layer SM. The drain electrode DE may be disposed on the insulating layer IL and the semiconductor layer SM. The drain electrode DE may be spaced apart from the source electrode SE, and may make contact with the semiconductor layer SM.

The transistor TR may be turned-on in response to the gate signal applied thereto through the gate line connected to the gate electrode GE. The turned-on transistor TR may provide the data voltage provided thereto through the source electrode SE connected to the data line to the drain electrode DE.

The data line extension portion DLE may be disposed in the non-display area NDA of the base substrate BS. The second portion DLE-2 may be disposed above the first portion DLE-1 by a dummy pattern portion DUM disposed between the data line extension portion DLE and the base substrate BS. In particular, the dummy pattern portion DUM may be disposed between the second portion DLE-2 and the base substrate BS, and may not be disposed between the first portion DLE-1 and the base substrate BS.

The dummy pattern portion DUM may be disposed in the non-display area NDA of the base substrate BS. The dummy pattern portion DUM may be disposed between the base substrate BS and the data line extension portions DLE. The dummy pattern portion DUM may be disposed on the same layer as the gate lines GL1 to GLn. The dummy pattern portion DUM may be formed together with the gate electrode GE and the gate lines GL1 to GLn when the gate electrode GE and the gate lines GL1 to GLn are formed. The dummy pattern portion DUM may include the same material as the gate lines GL1 to Gn. However, the inventive concepts are not limited thereto. In some exemplary embodiments, the dummy pattern portion DUM may include metal or non-metal material different from the gate lines GL1 to GLn.

The insulating layer IL may extend to the non-display area NDA. The insulating layer IL may be disposed on the dummy pattern portion DUM and the base substrate BS.

A portion of the insulating layer IL, which overlaps the dummy pattern portion DUM, may protrude toward the third direction D3. The data line extension portions DLE may be disposed on the insulating layer IL. The first portions DLE-1 of the data line extension portions DLE may be disposed on a portion of the insulating layer, which does not overlap the dummy pattern portion DUM. The second portions DLE-2 of the data line extension portions DLE may be disposed on the portion of the insulating layer IL, which overlaps the dummy pattern portion DUM. Accordingly, the second portions DLE-2 of the data line extension portions DLE may be disposed above the first portions DLE-1 in the third direction D3 due to the dummy pattern portion DUM disposed thereunder.

A difference in height "h" between the second portion DLE-2 and the first portion DLE-1 of the data line extension portion DLE may be equal to or less than about 7500 angstroms. However, the inventive concepts are not limited thereto. In some exemplary embodiments, the height difference "h" between the second portion DLE-2 and the first portion DLE-1 may vary depending on a thickness of the dummy pattern portion DUM.

In the non-display area NDA, another material may be further disposed between the data line extension portion DLE and the insulating layer IL. For example, a semiconductor material may be further disposed between the data line extension portion DLE and the insulating layer IL.

Referring to FIG. 4, the dummy pattern portion DUM may include a plurality of first dummy pattern portions DUM1 and a plurality of second dummy pattern portions DUM2. The first dummy pattern portions DUM1 may be disposed at a first position L1, and the second dummy pattern portions DUM2 may be disposed at a second position L2. The first position L1 and the second position L2 may correspond to predetermined positions in the second direction D2. For example, the first position L1 may be a position close to the display area DA, and the second position L2 may be a position spaced further apart from the display area DA in the second direction D2 than the first position L1.

The first dummy pattern portion DUM1 may be disposed between the second portions DLE-2 of the odd-numbered data line extension portions and the base substrate BS. The second dummy pattern portion DUM2 may be disposed between the second portions DLE-2 of the even-numbered data line extension portions and the base substrate BS.

The second portions DLE-2 of the odd-numbered data line extension portions may be disposed at the first position L1, and the second portions DLE-2 of the even-numbered data line extension portions may be disposed at the second position L2 due to the dummy pattern portions DUM.

In particular, a second portion DLE1-2 of the first data line extension portion DLE1 may be disposed at the first position L1. A second portion DLE2-2 of the second data line extension portion DLE2 may be disposed at the second position L2. A second portion DLE3-2 of the third data line extension portion DLE3 may be disposed at the first position L1. A second portion DLE4-2 of the fourth data line extension portion DLE4 may be disposed at the second position L2.

As such, the second portions DLE-2 of the data line extension portions DLE may be disposed to be staggered with each other.

As the second portions DLE-2 of the data line extension portions DLE are disposed to be staggered with each other, a step structure may be formed between the data line extension portions DLE.

For example, a first portion DLE2-1 of the second data line extension portion DLE2 may be disposed between the second portion DLE1-2 of the first data line extension portion DLE1 and the second portion DLE3-2 of the third data line extension portion DLE3 with respect to the first position L1. The first portion DLE4-1 of the fourth data line extension portion DLE4 may be disposed at a left side of the second portion DLE3-2 of the third data line extension portion DLE3. In this case, since the second portions DLE1-2 and DLE3-2 of the first data line extension portion DLE1 and the third data line extension portion DLE3 are disposed relatively above the first portions DLE2-1 and DLE4-1 of the second data line extension portion DLE2 and the fourth data line extension portion DLE4, the step structure may be formed between the data line extension portions DLE.

The dummy pattern portion DUM may include a plurality of dummies. Each dummy may have substantially a quadrangular shape when viewed in a plan view. However, the inventive concepts are not limited thereto, and in some exemplary embodiments, the shape of the dummy may be changed in various ways.

Due to the step structure formed between the data line extension portions DLE, a process of testing the data lines DL1 to DLm may be easily performed. This will be described in detail later with reference to the testing method of the data lines DL1 to DLm.

Figure 5:
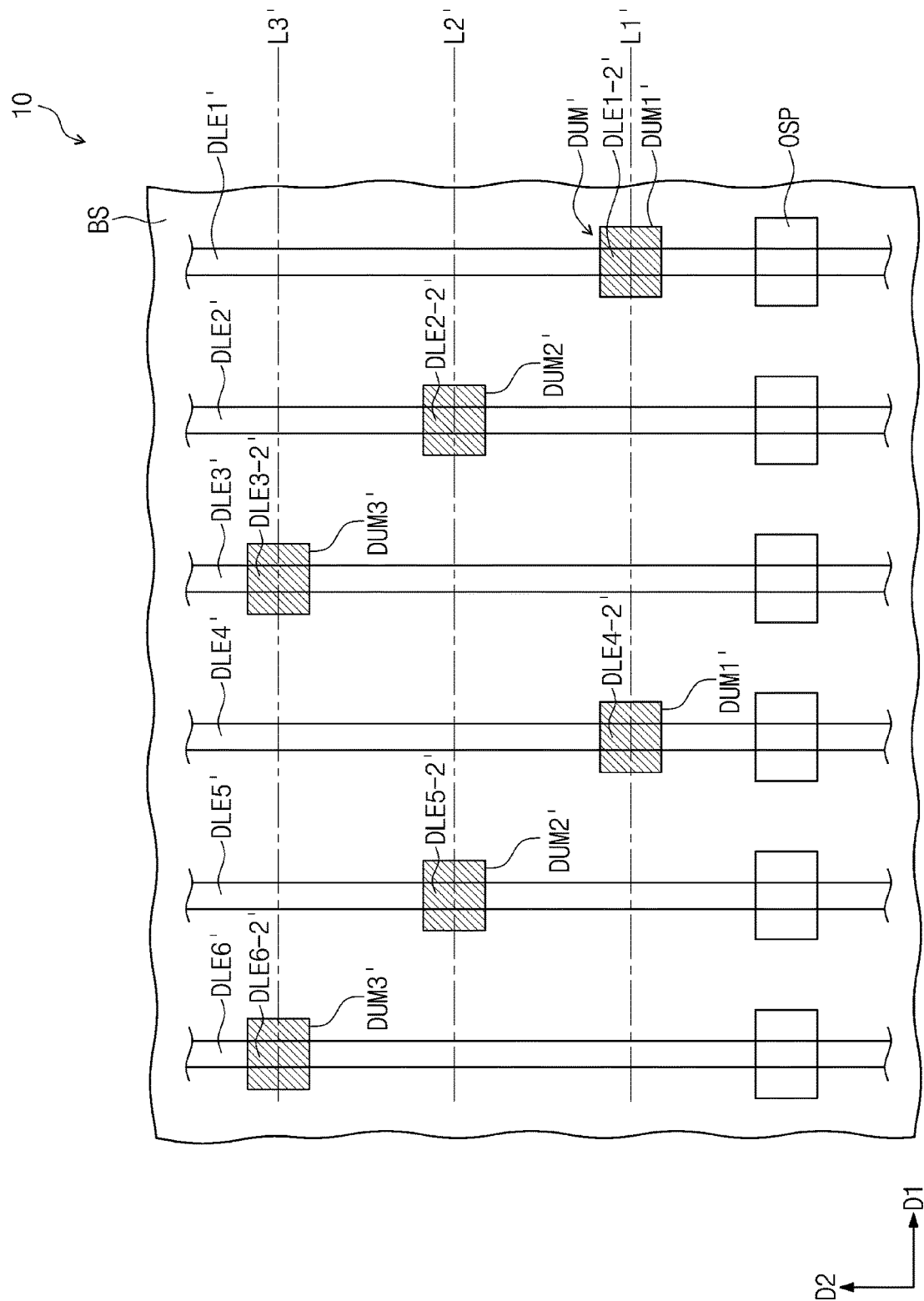
FIG. 5 is a plan view showing a first test portion of a display substrate according to another exemplary embodiment.
Figure 6:
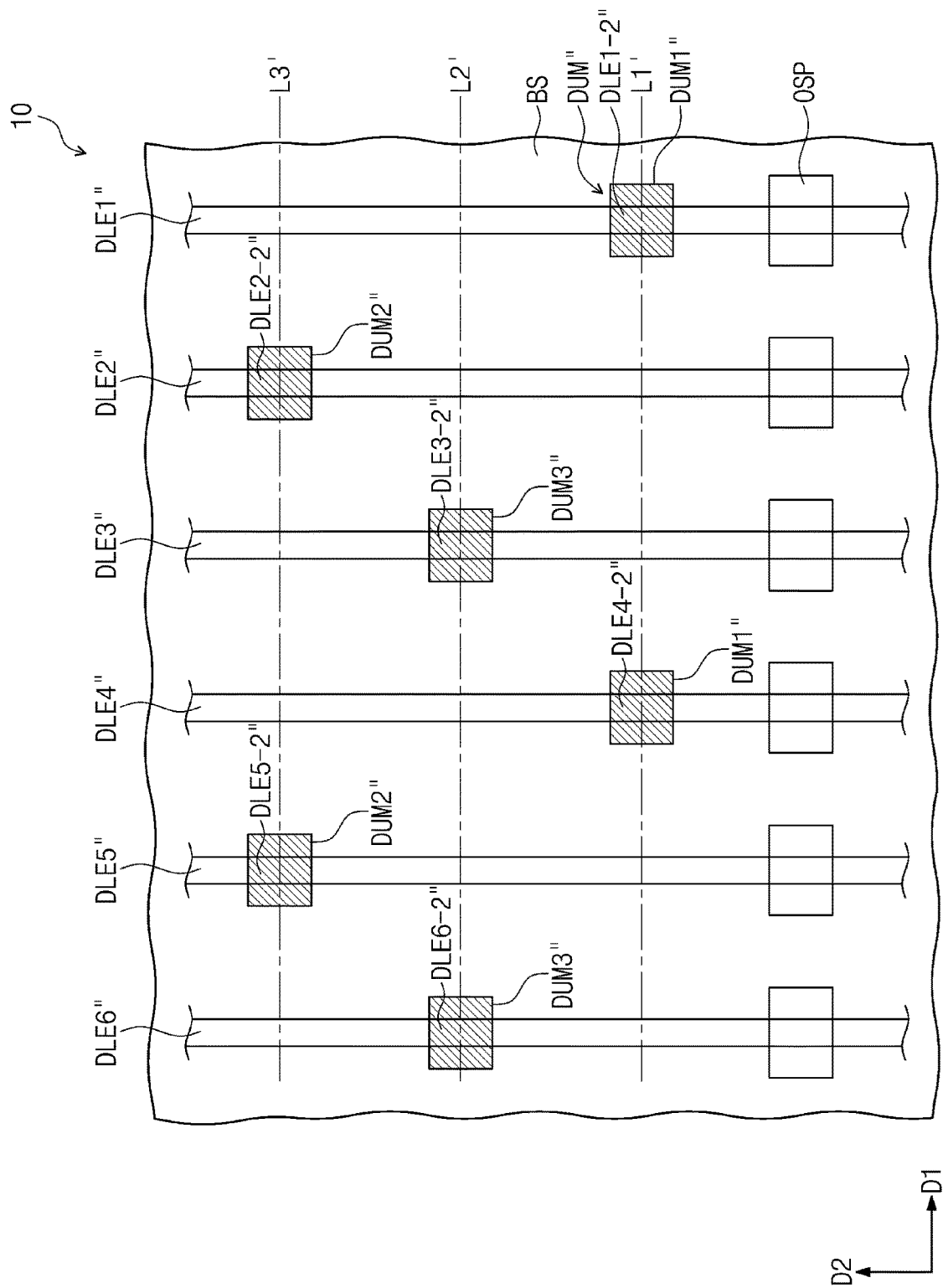
FIG. 6 is a plan view showing a first test portion of a display substrate according to another exemplary embodiment.

FIG. 5 is a plan view showing a first test portion 10 of a display substrate according to another exemplary embodiment. FIG. 6 is a plan view showing a first test portion 10 of a display substrate according to another exemplary embodiment.

The display substrates according to exemplary embodiments shown in FIGS. 5 and 6 may include dummy pattern portions DUM' and DUM" having different patterns from that described above. As such, substantially the same elements already described above with respect to FIG. 4 will be omitted, and different features will be mainly described with reference to FIGS. 5 and 6.

Referring to FIG. 5, the dummy pattern portion DUM' may include a first dummy pattern portion DUM1', a second dummy pattern portion DUM2', and a third dummy pattern portion DUM3'. The first dummy pattern portion DUM1' may be disposed at a first position L1', the second dummy pattern portion DUM2' may be disposed at a second position L2', and the third dummy pattern portion DUM3' may be disposed at a third position L3'. The first position L1', the second position L2', and the third position L3' may correspond to predetermined positions in the second direction D2. For example, the first position L1' may be a position closest to the display area DA, and the third position L3' may be a position farthest from the display area DA. The second position L2' may be located about halfway between the first position L1' and the third position L3'.

The first dummy pattern portion DUM1' may be disposed between second portions DLE1-2' and DLE4-2' of $(3K-2)^{th}$ data line extension portions and the base substrate BS. The second dummy pattern portion DUM2' may be disposed between second portions DLE2-2' and DLE5-2' of $(3K-1)^{th}$ data line extension portions and the base substrate BS. The third dummy pattern portion DUM3' may be disposed between second portions DLE3-2' and DLE6-2' of $3K^{th}$ data line extension portions and the base substrate BS. "K" is a natural number.

The second portions DLE1-2' and DLE4-2' of the $(3K-2)^{th}$ data line extension portions may be disposed at the first position L1' by the dummy pattern portion DUM'. The second portions DLE2-2' and DLE5-2' of the $(3K-1)^{th}$ data line extension portions may be disposed at the second position L2'. The second portions DLE3-2' and DLE 6-2' of the $3K^{th}$ data line extension portions may be disposed at the third position L3'.

In particular, the first dummy pattern portion DUM1' may be disposed at the first position L1'. The first dummy pattern portion DUM1' may be disposed between a first data line extension portion DLE1' and the base substrate BS, and between a fourth data line extension portion DLE4' and the base substrate BS. The second dummy pattern portion DUM2' may be disposed at the second position L2'. The second dummy pattern portion DUM2' may be disposed between a second data line extension portion DLE2' and the base substrate BS, and between a fifth data line extension portion DLE5' and the base substrate BS. The third dummy pattern portion DUM3' may be disposed at the third position L3'. The third dummy pattern portion DUM3' may be disposed between a third data line extension portion DLE3' and the base substrate BS, and between a sixth data line extension portion DLE6' and the base substrate BS.

Second portions DLE1-2' and DLE4-2' of the first data line extension portion DLE1' and the fourth data line extension portion DLE4' may be disposed at the first position L1' by the first dummy pattern portion DUM1'. Second portions DLE2-2' and DLE5-2' of the second data line extension portion DLE2' and the fifth data line extension portion DLE5' may be disposed at the second position L2' by the second dummy pattern portion DUM2'. Second portions DLE3-2' and DLE6-2' of the third data line extension portion DLE3' and the sixth data line extension portion DLE6' may be disposed at the third position L3' by the third dummy pattern portion DUM3'.

In this manner, the second portions of the data line extension portions may be disposed to be staggered with each other by the structure of the dummy pattern portion DUM'.

Referring to FIG. 6, a first dummy pattern portion DUM1" may be disposed at a first position L1', a second dummy pattern portion DUM2" may be disposed at a third position L3', and a third dummy pattern portion DUM3" may be disposed at a second position L2'.

The second portions of $(3K-2)^{th}$ data line extension portions may be disposed at the first position L1' by the structure of the dummy pattern portion DUM". The second portions of $(3K-1)^{th}$ data line extension portions may be disposed at the third position L3'. The second portions of $3K^{th}$ data line extension portions may be disposed at the second position L2'.

The second portions DLE1-2" and DLE-4-2" of the $(3K-2)^{th}$ data line extension portions may be disposed at the first position L1' by the dummy pattern portion DUM". The second portions DLE2-2" and DLE5-2" of the $(3K-1)^{th}$ data line extension portions may be disposed at the third position L3'. The second portions DLE3-2" and DLE6-2" of the 3Kth data line extension portions may be disposed at the second position L2'.

In particular, second portions DLE1-2" and DLE4-2" of a first data line extension portion DLE1" and a fourth data line extension portion DLE4" may be disposed at the first position L1' by the first dummy pattern portion DUM1". Second portions DLE2-2" and DLE5-2" of a second data line extension portion DLE2" and a fifth data line extension portion DLE5" may be disposed at the third position L3' by the second dummy pattern portion DUM2". Second portions DLE3-2" and DLE6-2" of a third data line extension portion DLE3" and a sixth data line extension portion DLE6" may be disposed at the second position L2' by the third dummy pattern portion DUM3".

In this manner, the second portions of the data line extension portions may be disposed to be staggered with each other by the structure of the dummy pattern portion DUM".

According to the above-described exemplary embodiments, a distance between the second portions of the data line extension portions adjacent to each other is widened with respect to the second direction D2, and thus, the process of testing the data lines may be performed more stably.

As described above, the dummy pattern portions DUM may be arranged in two to three rows in the second direction D2. However, the inventive concepts are not be limited thereto. In some exemplary embodiments, the dummy pattern portion DUM may be formed in various shapes, as long as the dummy pattern portion DUM forms a step structure between the data line extension portions DLE adjacent to each other.

Figure 7:
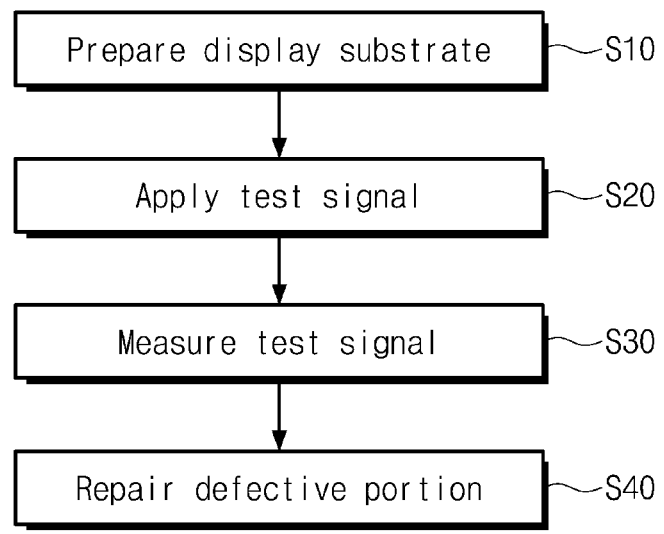
FIG. 7 is a flowchart illustrating a method of testing an open/short of data lines of a display substrate according to an exemplary embodiment.
Figure 8:
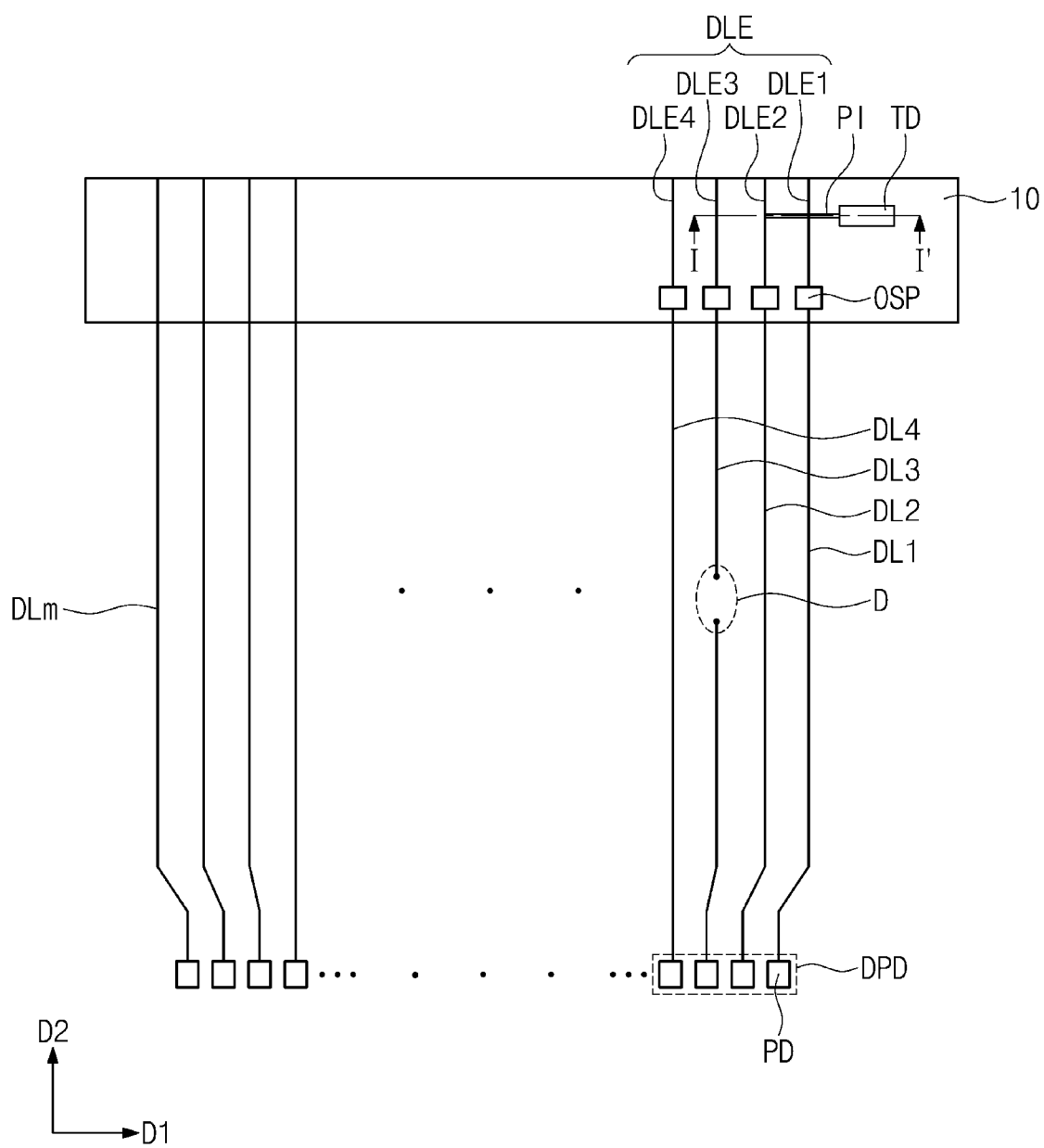
FIG. 8 is a view showing a test device located above a display substrate and one opened data line among the data lines arranged in the display substrate.
Figure 9:
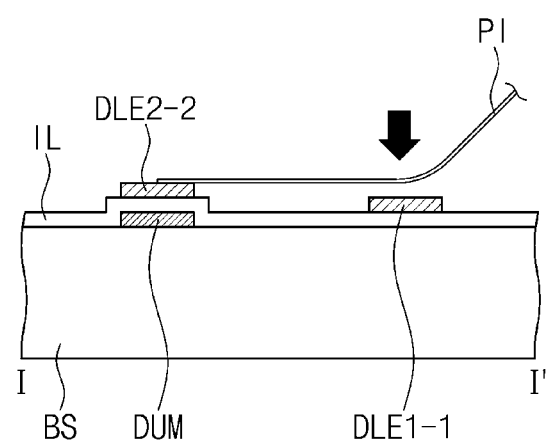
FIG. 9 is a cross-sectional view taken along line I-I' of FIG. 8.
Figure 9:
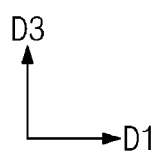
Figure 10:
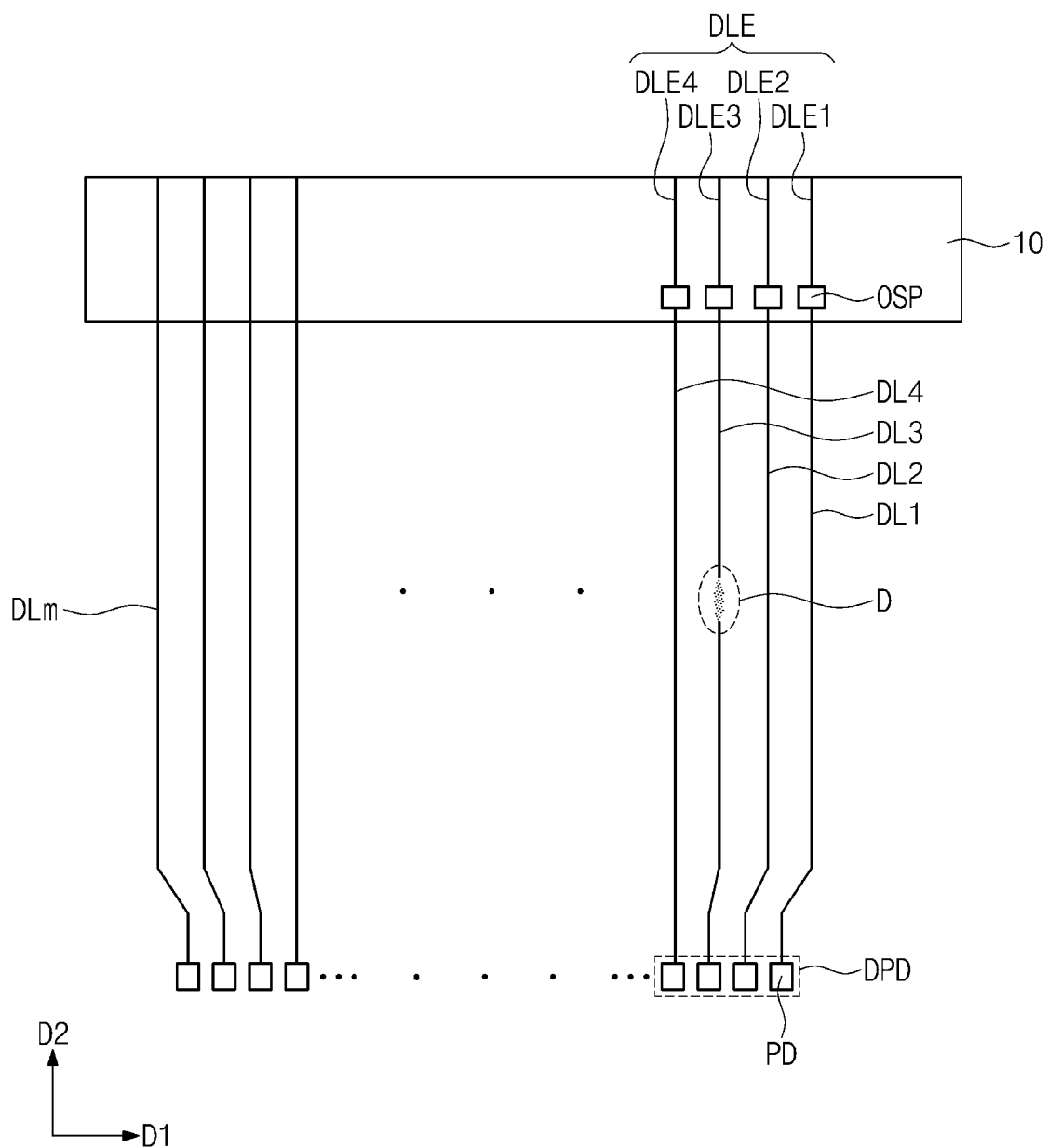
FIG. 10 is a view exemplarily showing a process of repairing the opened data line shown in FIG. 8.
Figure 11:
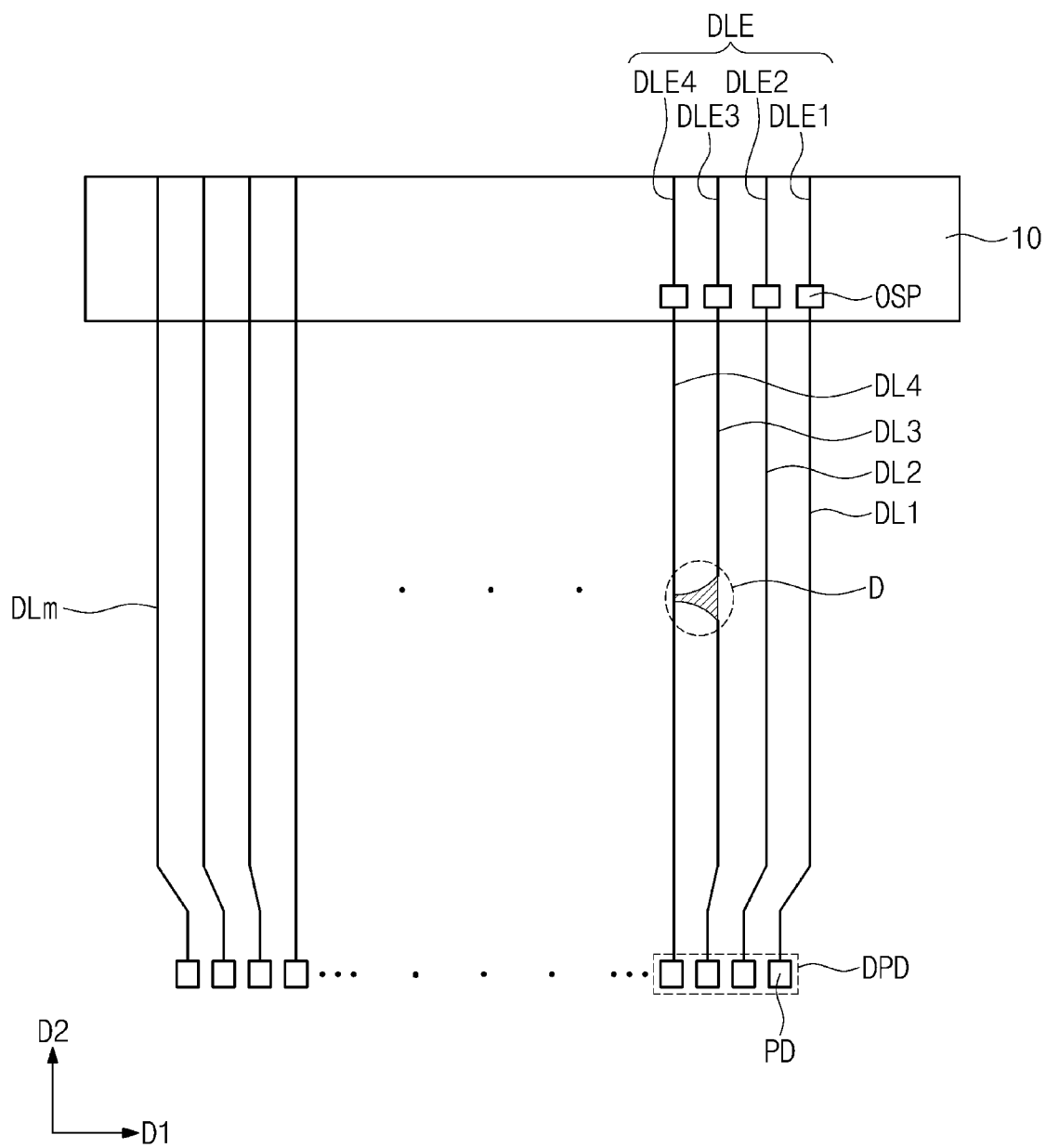
FIG. 11 is a view exemplarily showing a short circuit between two data lines adjacent to each other among the data lines.
Figure 12:
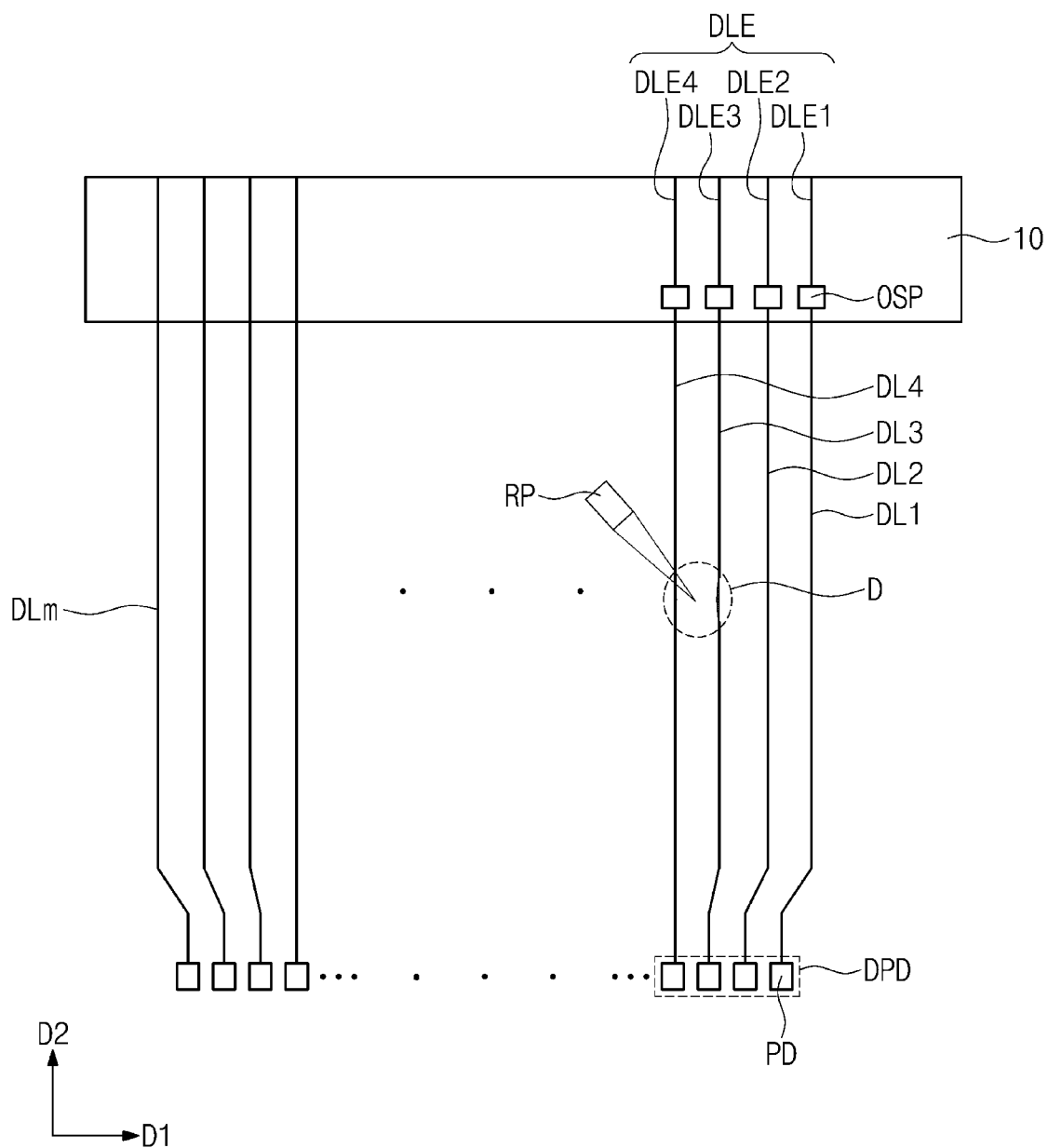
FIG. 12 is a view exemplarily showing a process of repairing the short circuit between the two data lines shown in FIG. 11.

FIG. 7 is a flowchart illustrating a method of testing an open/short of data lines of a display substrate according to an exemplary embodiment. FIG. 8 is a view showing a test device located above a display substrate and one opened data line among the data lines arranged in the display substrate. FIG. 9 is a cross-sectional view taken along line I-I' of FIG. 8. FIG. 10 is a view exemplarily showing a process of repairing the opened data line shown in FIG. 8. FIG. 11 is a view exemplarily showing a short circuit between two data lines adjacent to each other among the data lines. FIG. 12 is a view exemplarily showing a process of repairing the short circuit between the two data lines shown in FIG. 11.

Hereinafter, the method of testing the open/short of data lines will be described with reference to FIGS. 7 to 12.

The open/short test of the display substrate DS may be performed before the insulating layer is formed on the data lines DL1 to DLm. That is, the data lines DL1 to DLm and the data line extension portions DLE disposed on the base substrate BS may be exposed to the outside during the testing of the open/short.

Referring to FIG. 7, the display substrate DS is prepared (S10). The display substrate DS may include the gate lines GL1 to GLn, the data lines DL1 to DLm, and the data line extension portions DLE. One side of each of the data lines DL1 to DLm may be connected to the data pads DPD1 to DPDk, and the other side of each of the data lines DL1 to DLm may be connected to the data line extension portions DLE (refer to FIGS. 1 and 2).

Referring to FIGS. 7 and 8, a test signal is applied (S20). The test device TD may apply the test signal to the data line extension portions DLE. The test device TD may make contact with the data line extension portion DLE. For example, the test device TD may include a power feed pin PI.

The power feed pin PI of the test device TD may make contact with the second portions DLE-2 of the data line extension portions DLE. The test device TD may apply the test signal to the data line extension portions DLE through the power feed pin PI.

The test device TD may be configured to move in the first direction D1. For example, the test device TD may make contact with the second portion of the first data line extension portion DLE1, and may apply the test signal to the first data line extension portion DLE1. Then, the test device TD may move left and may make contact with the second portion of the second data line extension portion DLE2 to apply the test signal to the second data line extension portion DLE2.

The test device TD may press the power feed pin PI. For example, when the power feed pin PI makes contact with the second portion of one data line extension portion DLE, the test device TD may press the power feed pin PI for precise contact between the power feed pin PI and the data line extension portion DLE. In this manner, the power feed pin PI may stably make contact with the second portions by the pressing force.

Referring to FIG. 9, the power feed pin PI may make contact with only the data line extension portion that is to be tested due to the step structure formed between the data line extension portions. For example, a front portion of the power feed pin PI of the test device TD makes contact with the second portion DLE2-2 of the second data line extension portion DLE2. In this case, an intermediate portion and a rear portion of the power feed pin PI may be disposed above the first portion DLE1-1 of the first data line extension portion.

When the test device TD presses the power feed pin PI, the intermediate portion and the rear portion of the power feed pin PI may be curved downward. When the second portion DLE2-2 of the second data line extension portion is disposed at the same height as the first portion DLE1-1 of the first data line extension portion, the power feed pin PI may make contact with not only the second data line extension portion but also with the first data line extension portion. Accordingly, it may be difficult to accurately perform the open/short test on the second data line.

However, according to the exemplary embodiments, since the second portion DLE2-2 of the second data line extension portion is disposed at a position higher than the first portion DLE1-1 of the first data line extension portion adjacent to the second data line extension portion, the power feed pin PI may precisely make contact with only the second data line extension portion DLE2 while not contacting the first data line extension portion. Accordingly, the test device TD may accurately apply the test signal only to the data line to be tested. As such, the open/short test may be more accurately performed.

Referring back to FIG. 7, the test signal applied is measured (S30). In particular, the test signal applied by the test device TD may be transmitted to data pads DPD through the data line extension portion DLE and the data lines DL1 to DLm. A measuring device may be disposed on the data pads DPD, which may measure the test signal transmitted thereto.

The data pads DPD may include a plurality of pads PD. Each of the pads PD may be connected to a corresponding data line among the data lines DL1 to DLm.

The measuring device may measure the test signal while being spaced apart from each pad PD. For example, the measuring device may measure a capacitance of the pads PD, which may vary by the test signal. However, the inventive concepts are not limited thereto, and in some exemplary embodiments, a contact-type measuring device may be used as the measuring device.

Referring to FIGS. 7 and 8, a defective portion of the data lines DL1 to DLm is repaired (S40). However, when a normal test signal is measured from all data lines DL1 to DLm, the operation (S40) may be omitted. As shown in FIG. 8, when the third data line DL3 is opened, the normal test signal may not be measured from the third data line DL3.

When the defect is found during the testing process using the data line extension portions DLE, the open/short test may be performed once more using the OS pad OSP. In particular, when there is a certain data line that is considered defective, the test signal may be applied to the OS pad OSP connected to the corresponding data line to accurately confirm the defect.

Referring to FIG. 10, the opened third data line DL3 may be repaired (S40). For example, the repairing process may be performed by depositing a metal material on an opened portion D using a chemical vapor deposition (CVD) method. However, the inventive concepts are not limited thereto. For example, in some implementations, the opened line may be repaired using repair lines formed separately from the signal lines.

Referring to FIG. 11, when some data lines are short-circuited, the test signal may not be normally measured from the short-circuited data lines. For example, when the third data line DL3 and the fourth data line DL4 are short-circuited, the test signal may not be normally output from the data pads connected to the third data line DL3 and the fourth data line DL4.

Referring to FIG. 12, the short-circuited data lines may be repaired in operation (S40). The short of the data lines may generally be caused by the short circuit between two data lines. The short circuit between the data lines may be repaired using a laser device LD. The laser device LD may irradiate a laser beam to a portion D where the third data line DL3 and the fourth data line DL4 are short-circuited. The third data line DL3 and the fourth data line DL4 may be separated from each other by the irradiated laser beam.

As described above, the open/short test of the data lines may be performed by applying the test signal to the data line extension portion and measuring the applied test signal at the data pad.

Figure 13:
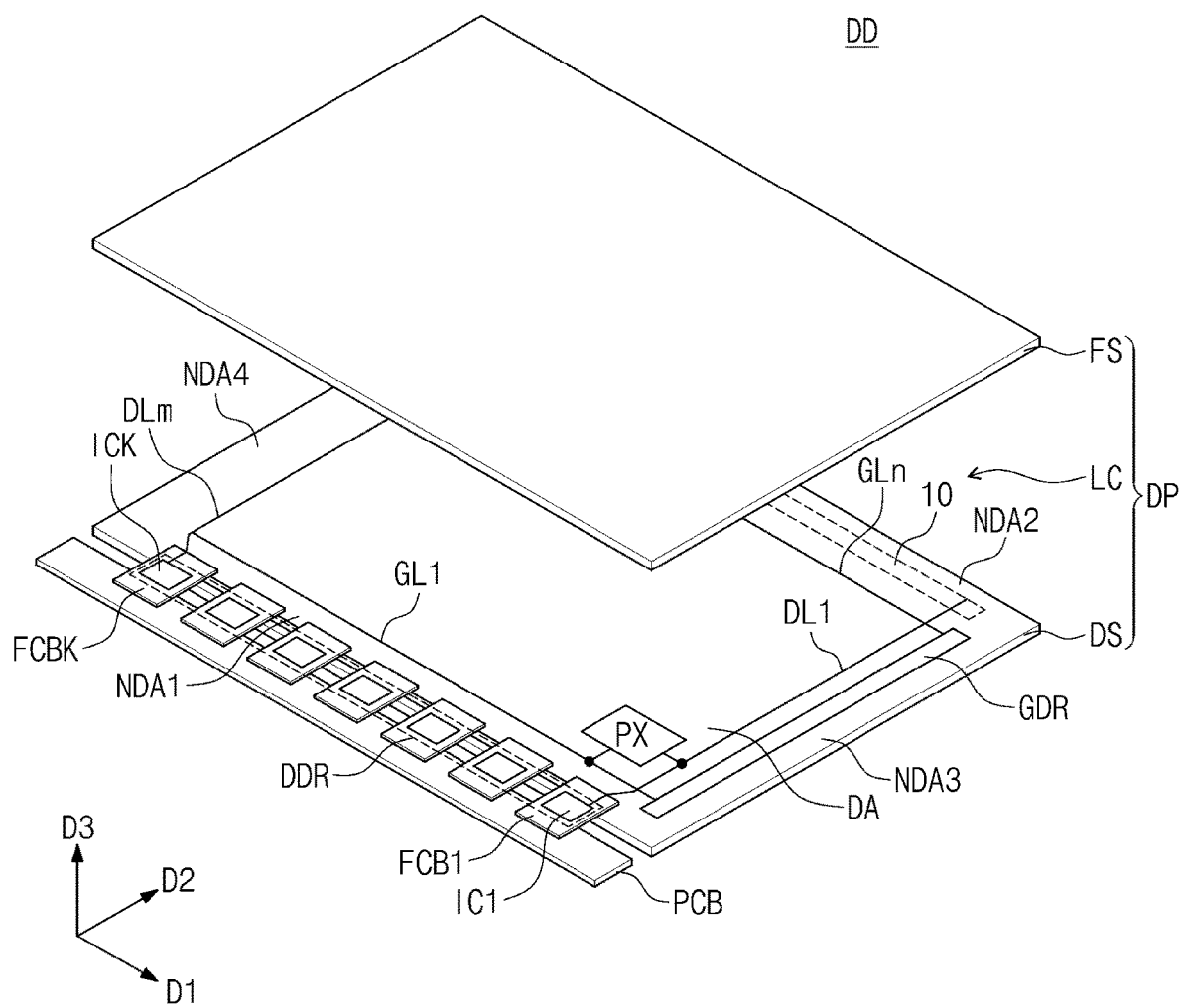
FIG. 13 is a perspective view showing a display device including a display substrate according to an exemplary embodiment.
Figure 14:
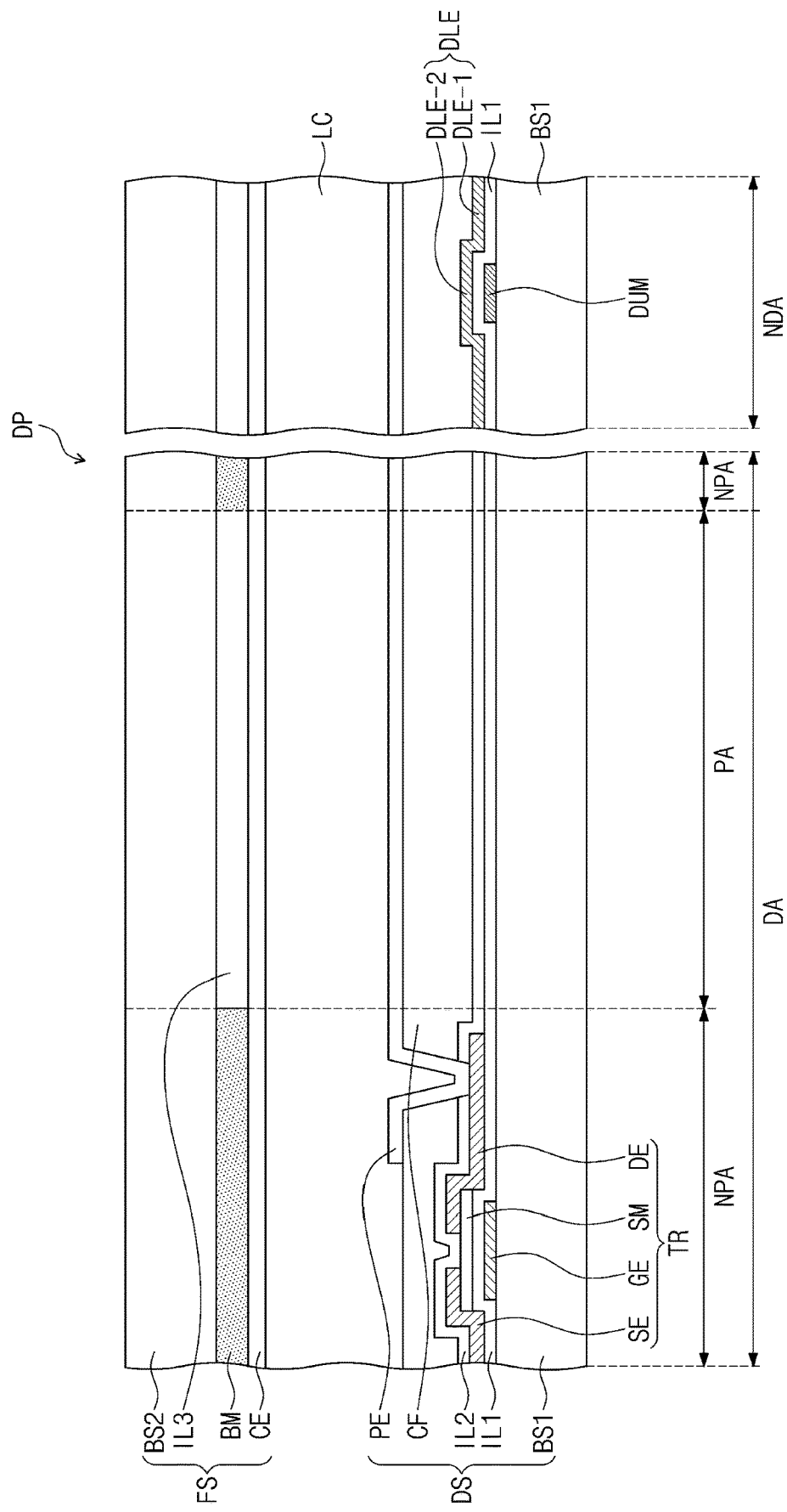
FIG. 14 is a cross-sectional view showing the display device shown in FIG. 13.

FIG. 13 is a perspective view showing a liquid crystal display device DD including a display substrate according to an exemplary embodiment. FIG. 14 is a cross-sectional view showing the display device DD shown in FIG. 13.

FIG. 13 exemplarily shows only one pixel PX. However, a plurality of pixels PX may be respectively arranged in areas defined by the gate lines GL1 to GLn and the data lines DL1 to DLm.

Hereinafter, the display device DD will be described as being a liquid crystal display device. However, the inventive concepts are not limited thereto. Referring to FIG. 13, the display device DD may include a display panel DP, a gate driver GDR, a data driver DDR, and a driving circuit board PCB.

The display panel DP may have substantially a rectangular shape defined by long sides in the first direction D1 and short sides in the second direction D2.

The display panel DP may include a display substrate DS, an opposite substrate FS facing the display substrate DS, and a liquid crystal layer LC disposed between the display substrate DS and the opposite substrate FS.

The pixels PX may be arranged on the display substrate DS. Although FIG. 13 exemplarily shows only one pixel PX, the plurality of pixels PX may be arranged in the display substrate DS. The pixels PX may be connected to the gate lines GL1 to GLn and the data lines DL1 to DLm.

The gate driver GDR may be disposed in the third non-display area NDA3. The gate driver GDR may generate the gate signals in response to a gate control signal provided from a timing controller mounted on the driving circuit board PCB. The gate signals may be applied to the pixels PX through the gate lines GL1 to GLn.

The data driver DDR may receive image signals and a data control signal from the timing controller. The data driver DDR may generate analog data voltages corresponding to the image signals in response to the data control signal. The data driver DDR may provide the data voltages to the pixels PX through the data lines DL1 to DLm. The data driver DDR may include a plurality of source driving chips IC1 to ICk. The source driving chips IC1 to ICk may be respectively mounted on corresponding flexible circuit boards FCB1 to FCBk, and may be connected to the driving circuit board PCB and the data pads DPD1 to DPDk of the first non-display area shown in FIG. 1.

The flexible circuit boards FCB1 to FCBk, on which the source driving chips IC1 to ICk are mounted, may be connected to corresponding data pads DPD1 to DPDk, respectively, by anisotropic conductive films, for example.

According to an exemplary embodiment, the source driving chips IC1 to ICk may be mounted on the flexible circuit boards FCB1 to FCBk in a tape carrier package (TCP) method. However, the inventive concepts are not limited thereto, and in some exemplary embodiments, the source driving chips IC1 to ICk may be mounted in the first non-display area NDA1 in a chip-on-glass (COG) method.

The first test portion 10 may be disposed in the second non-display area NDA2.

Referring to FIG. 14, the display substrate DS may include a first base substrate BS1, a color filter CF, a first insulating layer IL1, a second insulating layer IL2, the transistor TR, and a pixel electrode PE. The display area DA of the display substrate DS may be divided into a pixel area PA and a non-pixel area NPA around the pixel area PA.

The transistor TR may be disposed on the first base substrate BS1. The transistor TR may be disposed in the non-pixel area NPA. Since the structure of the transistor TR has been described in detail above, repeated descriptions thereof will be omitted.

The second insulating layer IL2 may cover the transistor TR. The color filter CF may be disposed on the second insulating layer IL2. The color filter CF may filter light emitted from a backlight unit to a color light. In some exemplary embodiments, the color filter CF may be disposed on the opposite substrate FS.

The pixel electrode PE may be disposed on the color filter CF. The pixel electrode PE may be disposed in the pixel area PA. The pixel electrode PE may be connected to the drain electrode DE after penetrating through the color filter CF and the second insulating layer IL2.

When the transistor TR is turned on by the gate signal, the data voltage may be provided to the pixel electrode PE through the turned-on transistor TR.

The opposite substrate FS may include a second base substrate BS2, a light blocking layer BM, a third insulating layer IL3, and a common electrode CE.

The second base substrate BS2 may be an insulating substrate having a light transmission property. The light blocking layer BM and the third insulating layer IL3 may be disposed under the second base substrate BS2.

The light blocking layer BM may be disposed to overlap the gate lines GL1 to GLn, the data lines DL1 to DLm, and the transistor TR. The light blocking layer BM may block light. However, the inventive concepts are not limited to a particular position of the light blocking layer BM. For example, in some exemplary embodiments, the light blocking layer BM may be disposed on the display substrate DS.

The common electrode CE may be disposed under the second base substrate BS2. A common voltage may be applied to the common electrode CE. When the common voltage is applied to the common electrode CE, the common electrode CE and the pixel electrode PE may generate an electric field acting on a liquid crystal layer LCL.

In some exemplary embodiments, alignment layers may be respectively disposed on the first base substrate BS1 and the second base substrate BS2.

The data line extension portions DLE may be disposed in the non-display area NPA of the display substrate DS. The data line extension portions DLE may extend from the data lines disposed in the display area DA. The first insulating layer IL1 may be disposed between the data line extension portions DLE and the first base substrate BS1.

As described above, the second portion DLE-2 of the data line extension portions DLE may be disposed at a position higher than the first portion DLE-1 thereof in the third direction D3. The dummy pattern portion DUM may be disposed between the second portion DLE-2 and the first base substrate BS1. The dummy patter portion DUM may be formed together with the gate lines GL1 to GLn when the gate lines GL1 to GLn are formed on the display substrate DS. The dummy pattern portion DUM and the gate lines GL1 to GLn may include substantially the same material.

Figure 15:
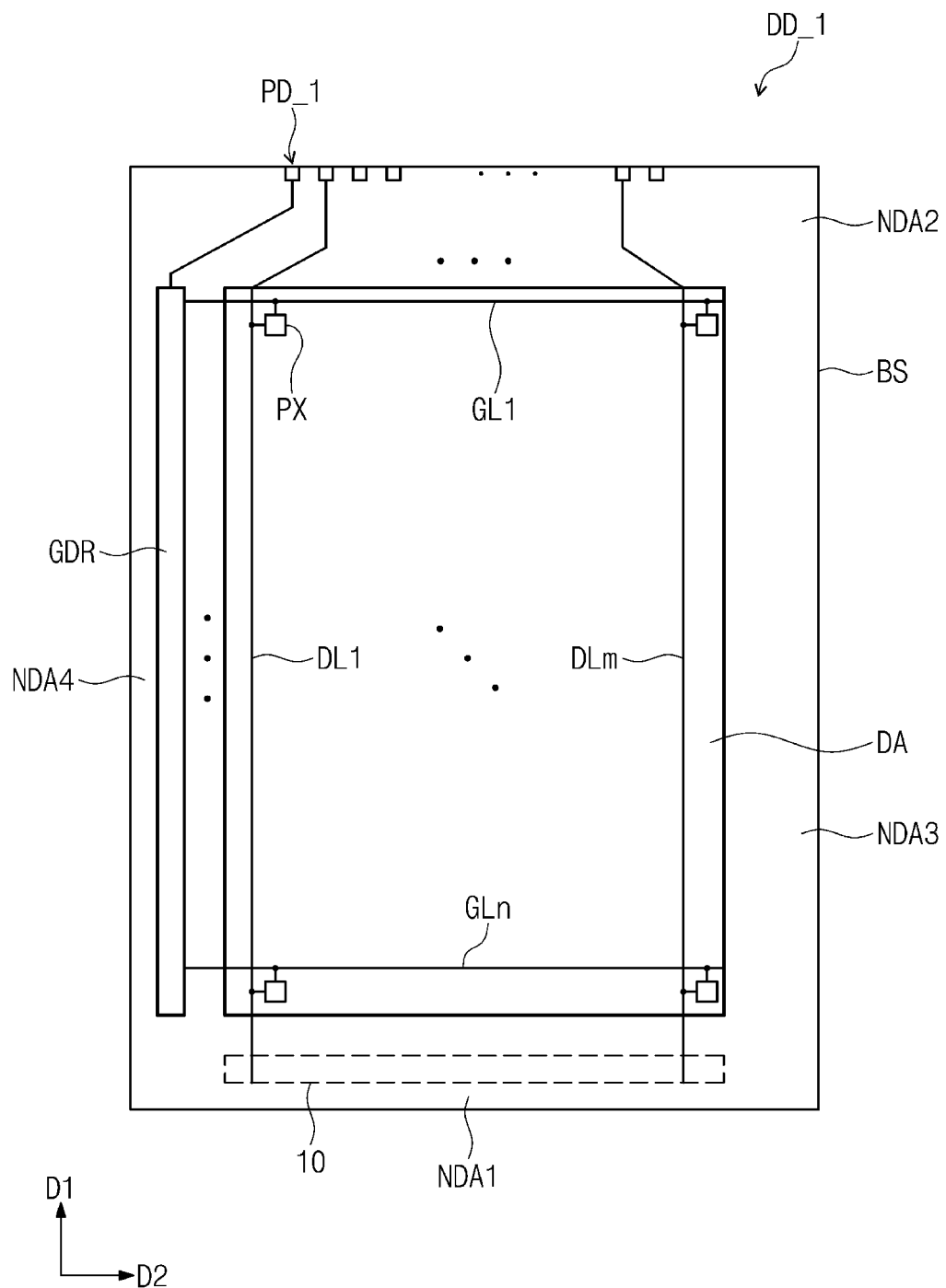
FIG. 15 is a plan view showing a display device including a display substrate according to an exemplary embodiment.
Figure 16:
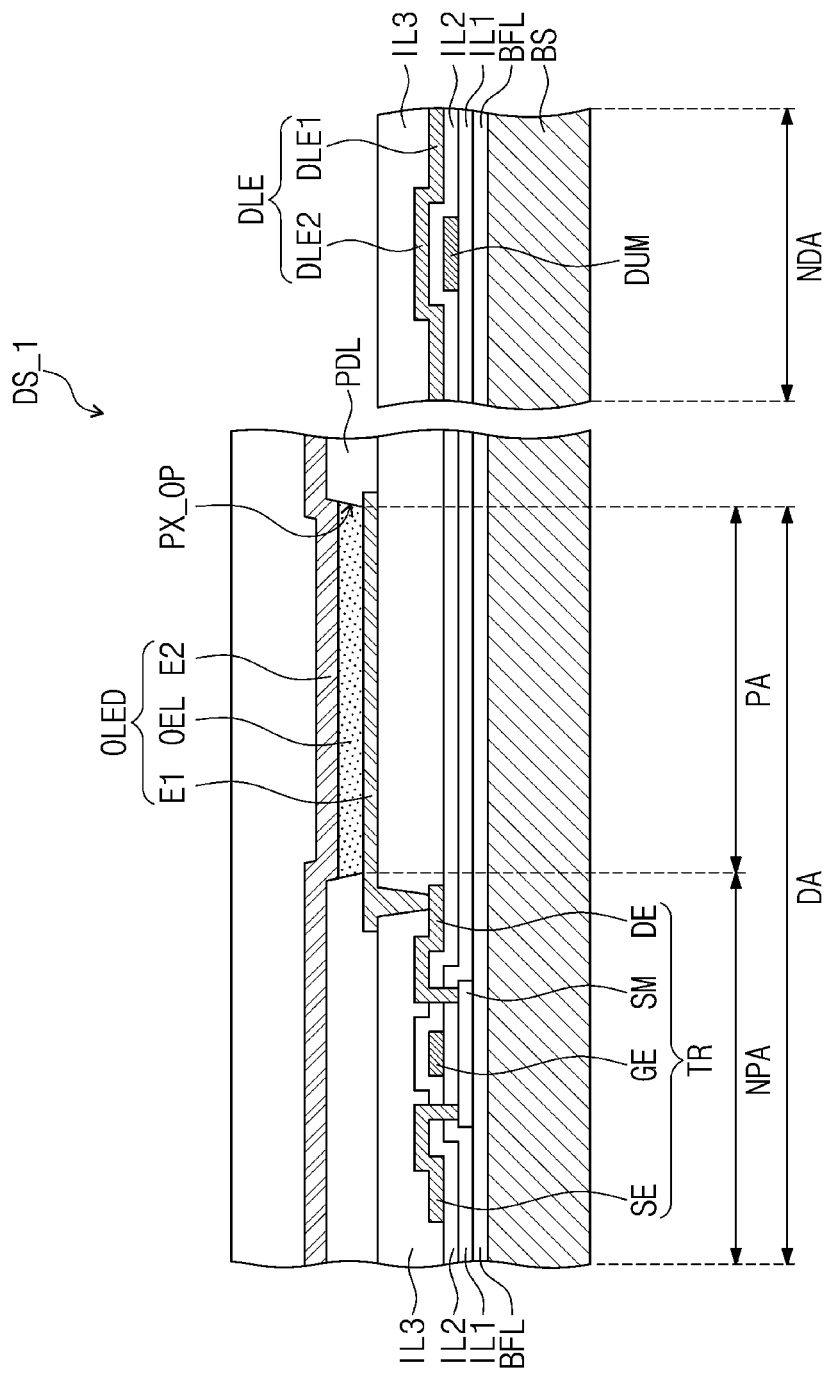
FIG. 16 is a cross-sectional view showing the display device shown in FIG. 15.

FIG. 15 is a plan view showing a display device DD_1 including a display substrate according to an exemplary embodiment, and FIG. 16 is a cross-sectional view showing the display device DD_1 shown in FIG. 15.

Referring to FIG. 15, the display device DD_1 according to the exemplary embodiment may be an organic light emitting display device. The display device DD_1 may include a display substrate DS_1, a gate driver GDR, and a data driver.

The display substrate DD_1 may include a plurality of pixels PX, a plurality of gate lines GL1 to GLn, and a plurality of data lines DL1 to DLm.

The display substrate DS_1 may include a display area DA and a non-display area NDA. The non-display area NDA may include a first non-display area NDA1 disposed at a lower side of the display area DA, a second non-display area NDA2 disposed at an upper side of the display area DA, a third non-display area NDA3 disposed at a right side of the display area DA, and a fourth non-display area NDA4 disposed at a left side of the display area DA.

A first test portion 10 may be disposed in the first non-display area NDA1. The first test portion 10 may have the same structure as that of the first test portion 10 described above.

A plurality of pads PD_1 may be disposed in the second non-display area NDA2. A data driver may be connected to the pads PD_1. The data driver may receive image signals having a converted data format, and may generate data voltages corresponding to the image signals in response to a data control signal. The data driver may be connected to the pads PD_1 and may provide the data voltages to the data lines.

A gate driver GDR may be disposed in the fourth non-display area NDA4.

The pixels PX may receive the data voltages in response to the gate signals. The pixels PX may emit light having brightness corresponding to the data voltages in response to light emission signals, and may display the image. A light emission time of the pixels PX may be controlled by the light emission signals.

Referring to FIG. 16, the display substrate DS_1 may include a light emitting element OLED and a transistor TR connected to the light emitting element OLED. The light emitting element OLED may include a first electrode E1, a second electrode E2, and an organic light emitting layer OEL disposed between the first electrode E1 and the second electrode E2. The light emitting element OLED may be an organic light emitting element.

The first electrode E1 may be an anode electrode, and the second electrode E2 may be a cathode electrode. The first electrode E1 may be defined as a pixel electrode, and the second electrode E2 may be defined as a common electrode.

The display area DA may include a pixel area PA and a non-pixel area NPA. The light emitting element OLED may be disposed in the pixel area PA, and the transistor TR may be disposed in the non-pixel area NPA.

The transistor TR and the light emitting element OLED may be disposed on a base substrate BS. A buffer layer BFL may be disposed on the base substrate BS, and the buffer layer BFL may include an inorganic material.

A semiconductor layer SM of the transistor TR may be disposed on the buffer layer BFL. The semiconductor layer SM may include a source area, a drain area, and a channel area defined between the source area and the drain area.

A first insulating layer IL1 may be disposed on the buffer layer BFL to cover the semiconductor layer SM. The first insulating layer IL1 may include an inorganic material. A gate electrode GE of the transistor TR may be disposed on the first insulating layer IL1 to overlap the semiconductor layer SM. The gate electrode GE may be disposed to overlap the channel area of the semiconductor layer SM.

A second insulating layer IL2 may be disposed on the first insulating layer IL1 to cover the gate electrode GE. The second insulating layer IL2 may include an organic material or an inorganic material.

A source electrode SE and a drain electrode DE of the transistor TR may be disposed to be spaced apart from each other on the second insulating layer IL2. The source electrode SE and the drain electrode DE may be connected to the semiconductor layer SM after penetrating through the first insulating layer IL1 and the second insulating layer IL2.

A third insulating layer IL3 may be disposed on the second insulating layer IL2 to cover the source electrode SE and the drain electrode DE of the transistor TR. The third insulating layer IL3 may be defined as a planarization layer that provides a flat upper surface, and may include an organic material.

The first electrode E1 may be disposed on the third insulating layer IL3. The first electrode E1 may be connected to the drain electrode DE of the transistor TR after penetrating through the third insulating layer IL3.

A pixel definition layer PDL may be disposed on the first electrode E1 and third insulating layer IL3, such that a predetermined portion of the first electrode E1 is exposed. An opening PX_OP may be defined through the pixel definition layer PDL to expose the predetermined portion of the first electrode E1.

The organic light emitting layer OEL may be disposed on the first electrode E1 in the opening PX_OP. The organic light emitting layer OEL may generate light having one of red, green, and blue colors, without being limited thereto. In some exemplary embodiments, the organic light emitting layer OEL may generate a white light by combining organic materials respectively generating the red, green, and blue colors.

The second electrode E2 may be disposed on the pixel definition layer PDL and the organic light emitting layer OEL. A thin film encapsulation layer TFE may be disposed on the light emitting element OLED to cover the pixel PX. A layer between the base substrate BS and the thin film encapsulation layer TFE may be defined as a pixel layer.

A first voltage may be applied to the first electrode E1, and a second voltage may be applied to the second electrode E2. Holes and electrons are injected into the organic light emitting layer OEL and are recombined in the organic light emitting layer OEL to generate excitons. The light emitting element OLED may emit light when an excited state of the excitons returns to a ground state. The light emitting element OLED may emit light of the red, green, and blue colors in accordance with a flow of current, and thus, the image may be displayed.

Data line extension portions DLE may be disposed in the non-display area NDA of the display substrate DS_1. The data line extension portions DLE may extend from the data lines disposed in the display area DA. The first and second insulating layers IL1 and IL2 may be disposed between the data line extension portions DLE and the base substrate BS. The light emitting element OLED may be omitted in the non-display area NDA.

A second portion DLE-2 of the data line extension portions DLE may be disposed at a position higher than a first portion DLE-1 thereof. A dummy pattern portion DUM may be disposed between the second portion DLE-2 and the base substrate BS. The dummy pattern portion DUM may be formed together with gate lines GL1 to GLn when the gate lines GL1 to GLn are formed on the display substrate DS_1. The dummy pattern portion DUM may include substantially the same material as the gate lines GL1 to Gn.

According to the exemplary embodiments, each of the data line extension portions disposed in the non-display area of the display substrate includes the first portion and the second portion disposed at a relatively higher position than the first portion. In addition, the second portions defined in the data line extension portions adjacent to each other are disposed to be staggered with each other in one direction. In this manner, a step difference structure is formed between the data line extension portions, thereby facilitating a power feed pin of a test device to make contact with only the data line extension portion that is to be tested, thus, allowing the open/short test to be easily performed.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display substrate comprising:
    a base substrate having a display area and a non-display area around the display area;
    a plurality of gate lines disposed in the display area and extending in a first direction;
    a plurality of data lines disposed in the display area, insulated from the gate lines, and extending in a second direction crossing the first direction; and
    a plurality of data line extension portions extending from the data lines to the non-display area,
    wherein each of the data line extension portions includes a first portion disposed on a same layer as the data lines and a second portion disposed at a higher position than the first portion and the data lines.

2. The display substrate of claim 1, wherein the second portions of the data line extension portions are disposed to be staggered with each other.

3. The display substrate of claim 2, further comprising a dummy pattern portion disposed between the base substrate and the second portion.

4. The display substrate of claim 3, wherein the dummy pattern portion includes:
    a plurality of first dummy pattern portions disposed between the second portions of odd-numbered data line extension portions and the base substrate; and
    a plurality of second dummy pattern portions disposed between the second portions of even-numbered data line extension portions and the base substrate.

5. The display substrate of claim 4, wherein the first dummy pattern portions are spaced apart from the second dummy pattern portions in the second direction.

6. The display substrate of claim 3, wherein the dummy pattern portion includes:
    a first dummy pattern portion disposed between the second portions of $(3K-2)^{th}$ data line extension portions and the base substrate;
    a second dummy pattern portion disposed between the second portions of $(3K-1)^{th}$ data line extension portions and the base substrate; and
    a third dummy pattern portion disposed between the second portions of $3K^{th}$ data line extension portions and the base substrate, "K" is a natural number, and
    wherein the first dummy pattern portion, the second dummy pattern portion, and the third dummy pattern portion are spaced apart from each other in the second direction.

7. The display substrate of claim 3, wherein the dummy pattern portion is disposed on the same layer as the gate lines.

8. The display substrate of claim 3, further comprising an insulating layer disposed between the first portions of the data line extension portions and the base substrate, and between the second portions of the data line extension portions and the dummy pattern portion.

9. The display substrate of claim 3, wherein the dummy pattern portion and the gate lines comprise substantially the same material.

10. The display substrate of claim 1, wherein a difference in height between the first portions and the second portions of the data line extension portions is equal to or less than about 7500 angstroms.

11. The display substrate of claim 1, wherein a distance between the data line extension portions is equal to or less than about 50 micrometers.

12. The display substrate of claim 1, further comprising a plurality of output selection (OS) pads disposed under the data line extension portions and contacting the data line extension portions.

13. A method of testing a display substrate, comprising:
    preparing a display substrate including a plurality of gate lines extending in a first direction, a plurality of data lines extending in a second direction crossing the first direction, and a plurality of data line extension portions extending from one sides of the data lines;
    applying a test signal to the data line extension portions; and
    measuring the test signal applied to the data line extension portions at the other sides of the data lines,
    wherein each of the data line extension portions includes a first portion disposed on a same layer as the data lines and a second portion disposed higher position than the first portion and the data lines.

14. The method of claim 13, wherein:
    the second portions of the data line extension portions are disposed to be staggered with each other; and
    the display substrate further includes a dummy pattern portion disposed between the display substrate and the second portions.

15. The method of claim 14, wherein the dummy pattern portion comprises:
    a first dummy pattern portion disposed between the second portions of odd-numbered data line extension portions and the display substrate; and
    a second dummy pattern portion disposed between the second portions of even-numbered data line extension portions and the display substrate, and spaced apart from the first dummy pattern portion in the second direction.

16. The method of claim 14, wherein the dummy pattern portion is disposed on the same layer as the gate lines.

17. The method of claim 13, further comprising repairing a data line having a defect after the measuring of the test signal at the other sides of the data lines.

18. A display device comprising:
    a first base substrate having a display area and a non-display area around the display area;

a plurality of gate lines disposed in the display area and extending in a first direction;

a plurality of data lines disposed in the display area, insulated from the gate lines, and extending in a second direction crossing the first direction;

a plurality of pixels connected to the gate lines and the data lines; and a plurality of data line extension portions extending from the data lines to the non-display area, wherein each of the data line extension portions includes a first portion disposed on a same layer as the data lines and a second portion disposed at a higher position than the first portion and the data lines.

19. The display device of claim 18, further comprising:
a second base substrate facing the first base substrate; and
a liquid crystal layer disposed between the first base substrate and the second base substrate.

20. The display device of claim 18, wherein each of the pixels includes:
a transistor connected to a corresponding gate line and a corresponding date line; and
organic light emitting element connected to the transistor.

* * * * *